(12) United States Patent
Pavlin

(10) Patent No.: US 8,547,671 B2
(45) Date of Patent: Oct. 1, 2013

(54) ELECTRONIC DEVICE FOR PROTECTING AGAINST A POLARITY REVERSAL OF A DC POWER SUPPLY VOLTAGE, AND ITS APPLICATION TO MOTOR VEHICLES

(75) Inventor: Antoine Pavlin, Puyricard (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 223 days.

(21) Appl. No.: 12/842,766

(22) Filed: Jul. 23, 2010

(65) Prior Publication Data

US 2011/0026171 A1 Feb. 3, 2011

(30) Foreign Application Priority Data

Jul. 28, 2009 (FR) ...................................... 09 55273

(51) Int. Cl.
*H02H 3/00* (2006.01)
*H02H 3/18* (2006.01)

(52) U.S. Cl.
USPC ................... 361/84; 361/88; 361/82; 361/83; 361/90

(58) Field of Classification Search
USPC ..................................... 361/84, 88, 82, 33, 90
See application file for complete search history.

(56) References Cited

U.S. PATENT DOCUMENTS

| | | | |
|---|---|---|---|
| 5,159,207 A | | 10/1992 | Pavlin et al. |
| 5,517,379 A | * | 5/1996 | Williams et al. ................. 361/84 |
| 5,536,977 A | * | 7/1996 | Williams ........................ 307/43 |
| 5,682,050 A | | 10/1997 | Williams |
| 5,760,449 A | * | 6/1998 | Welch ............................ 257/369 |
| 5,804,866 A | * | 9/1998 | Aiello et al. ................... 257/577 |
| 6,043,965 A | * | 3/2000 | Hazelton et al. ................ 361/84 |
| 6,304,422 B1 | * | 10/2001 | Sander et al. .................... 361/84 |
| 6,426,857 B1 | | 7/2002 | Doster et al. |
| 6,501,632 B1 | * | 12/2002 | Avery et al. .................... 361/111 |
| 7,030,591 B2 | * | 4/2006 | Stellberger ..................... 320/134 |
| 7,283,343 B2 | * | 10/2007 | Grose et al. ..................... 361/84 |
| 7,504,750 B2 | | 3/2009 | Bienvenu et al. |
| 7,554,777 B2 | * | 6/2009 | Fukami ........................... 361/18 |
| 8,004,238 B2 | * | 8/2011 | Kim et al. ..................... 320/118 |
| 8,013,475 B2 | * | 9/2011 | Wotruba et al. ............... 307/130 |
| 8,094,423 B2 | * | 1/2012 | Bouchet et al. .............. 361/91.1 |

FOREIGN PATENT DOCUMENTS

| | | |
|---|---|---|
| EP | 0 626 745 A2 | 11/1994 |
| EP | 1 465 046 A1 | 10/2004 |
| EP | 1 840 965 A2 | 10/2007 |

OTHER PUBLICATIONS

Hong et al., "A Reverse-Voltage Protection Circuit for MOSFET Power Switches," IEEE Journal of Solid-State Circuits, vol. 36, No. 1 (pp. 152-155).

* cited by examiner

*Primary Examiner* — Rexford N Barnie
*Assistant Examiner* — Zeev V Kitov
(74) *Attorney, Agent, or Firm* — Slater & Matsil, L.L.P.

(57) ABSTRACT

The electronic device for protecting against a polarity reversal of a DC power supply voltage comprises, produced within one and the same integrated circuit, an N-channel main transistor (TP) mounted on the line of expected positive polarity of the power supply voltage and command means (MCM) for the main transistor comprising a charging pump circuit (CP), associated with a dynamic biasing circuit (MCTRL) for the substrate regions of active components connected to the main transistor.

13 Claims, 3 Drawing Sheets

US 8,547,671 B2

ELECTRONIC DEVICE FOR PROTECTING AGAINST A POLARITY REVERSAL OF A DC POWER SUPPLY VOLTAGE, AND ITS APPLICATION TO MOTOR VEHICLES

This application claims priority to French Patent Application 09-55273, which was filed Jul. 28, 2009 and is incorporated herein by reference.

TECHNICAL FIELD

The invention relates to the protection of electronic components against a polarity reversal of a power supply voltage, and more particularly to the integrated circuits used to produce such protection.

BACKGROUND

The invention applies advantageously but not exclusively to the field of motor vehicles for the protection of an electronic entity such as, for example, a control unit or a processor, against a reversal of the expected polarity of the DC power supply voltage intended for this electronic entity.

The devices for protecting against polarity reversals of a DC power supply voltage make it possible to avoid the flow of reverse currents through electronic components during said polarity reversal.

Currently, there are a number of solutions for producing protection against these polarity reversals. Notable among these is the series connection of diodes in the power supply line. However, such a solution generates unacceptable power dissipations when the current in the electronic entity to be protected, a control unit for example, exceeds 5 amps. Now, electronic control units that can be used in motor vehicle applications can control charging currents ranging from 20 to 40 amps. Furthermore, the series-connected diodes in conjunction with the inductance of the power supply line, and the capacitors of the power supply filters usually present in the electronic control units, create a rectified resonant circuit which can generate overvoltage conditions on the power supply line of the controlling electronic unit to be protected.

Another solution consists in inserting an electromechanical relay into the positive power supply line, the command coil being powered between the positive and negative power supply terminals. Such an arrangement forces the relay to close in the presence of a minimum voltage difference between the positive and negative terminals of the power supply and forces the relay to open if the voltage present at the positive power supply terminal drops to a value close to zero or becomes negative relative to the negative power supply terminal.

Such a solution does not present the drawbacks of the previous solution, but does require bulky relays, which may be incompatible with the physical place that is to receive the electronic entity to be protected. Furthermore, such relays must be assembled manually on the electronic entity when the current conveyed by the latter exceeds a few amps, because such relays cannot be mounted as surface components.

Another solution consists in placing a P-channel MOS transistor in the positive power supply line. Although this solution offers the benefit of the simplicity of a command circuit for the PMOS transistor, it nevertheless presents a drawback in terms of surface footprint because of the large size of a power PMOS transistor.

Another solution consists in placing an N-channel MOS transistor in the negative polarity line. However, such a solution requires the negative output terminal of the electronic unit to be protected, to which loads are connected, to be connected in return to the negative power supply terminal of this electronic unit so as to avoid the flow of negative currents in all the loads connected to the electronic unit during a polarity reversal of the power supply voltage. Now, in some applications, for example motor vehicle applications, the negative terminals of the loads are directly connected in return to the negative power supply terminal without going back through the electronic unit which controls these loads.

Furthermore, analogue components external to the electronic unit, sensors for example, may not be electrically compatible with electronic unit input terminals becoming negative during a polarity reversal.

It has also been proposed in the prior art to insert an N-channel transistor into the positive power supply line, associated with an external discrete command component, such as a charging pump, capable of supplying a command voltage to the gate of the transistor that is greater than the power supply voltage in normal operation. However, such a solution using an external discrete charging pump has a significant surface footprint, and causes a strong electromagnetic noise to be generated because of the relatively high value of the capacitors of the charging pump used in discrete charging pump implementations.

SUMMARY OF THE INVENTION

According to a one embodiment, there is proposed an electronic device for protecting against a polarity reversal of a DC power supply voltage comprising, produced within one and the same integrated circuit, an N-channel main transistor, mounted on the line of expected positive polarity of the power supply voltage, and command means for the main transistor comprising a charging pump circuit, associated with a dynamic biasing circuit for the substrate regions of components, notably of the active components connected to the main transistor.

More generally, according to one aspect, there is proposed an electronic device, comprising input means having a first input terminal for receiving an expected positive polarity of an input DC power supply voltage, output means having a first output terminal for delivering the positive polarity of an output DC power supply voltage, and electronic means for protecting against a polarity reversal of the input power supply voltage, coupled between the input means and the output means.

According to a general characteristic of this aspect, the protection means are produced in an integrated fashion and comprise
an N-channel main transistor, the source of which is coupled to the first input terminal and the drain of which is coupled to the first output terminal,
command means configured to render the main transistor blocked in the event of a polarity reversal and conducting otherwise, and
control means configured to dynamically adjust the bias of the substrate regions of components, notably active components, connected to the main transistor.

According to some embodiments, the control means comprise:
a first control transistor having a substrate region connected to its source, a drain connected to the source of the main transistor, and a gate connected to the drain of the main transistor, and
a second control transistor, configured to be always conducting, having its source connected to the drain of the main transistor, its substrate region connected to its drain and to the substrate region of the first control transistor and its gate connected to its drain, the drain of this second control transistor also being connected to the source of the first control transistor, and the substrate regions of some of said components, notably active components, are connected to the substrate regions of the first and second control transistors which themselves form part of said components, notably active components.

BRIEF DESCRIPTION OF THE DRAWINGS

Other benefits and features of the invention will become apparent from studying the detailed description of embodiments, which are by no means exclusive, and the appended drawings, in which.

DETAILED DESCRIPTION OF ILLUSTRATIVE EMBODIMENTS

Figure 1:
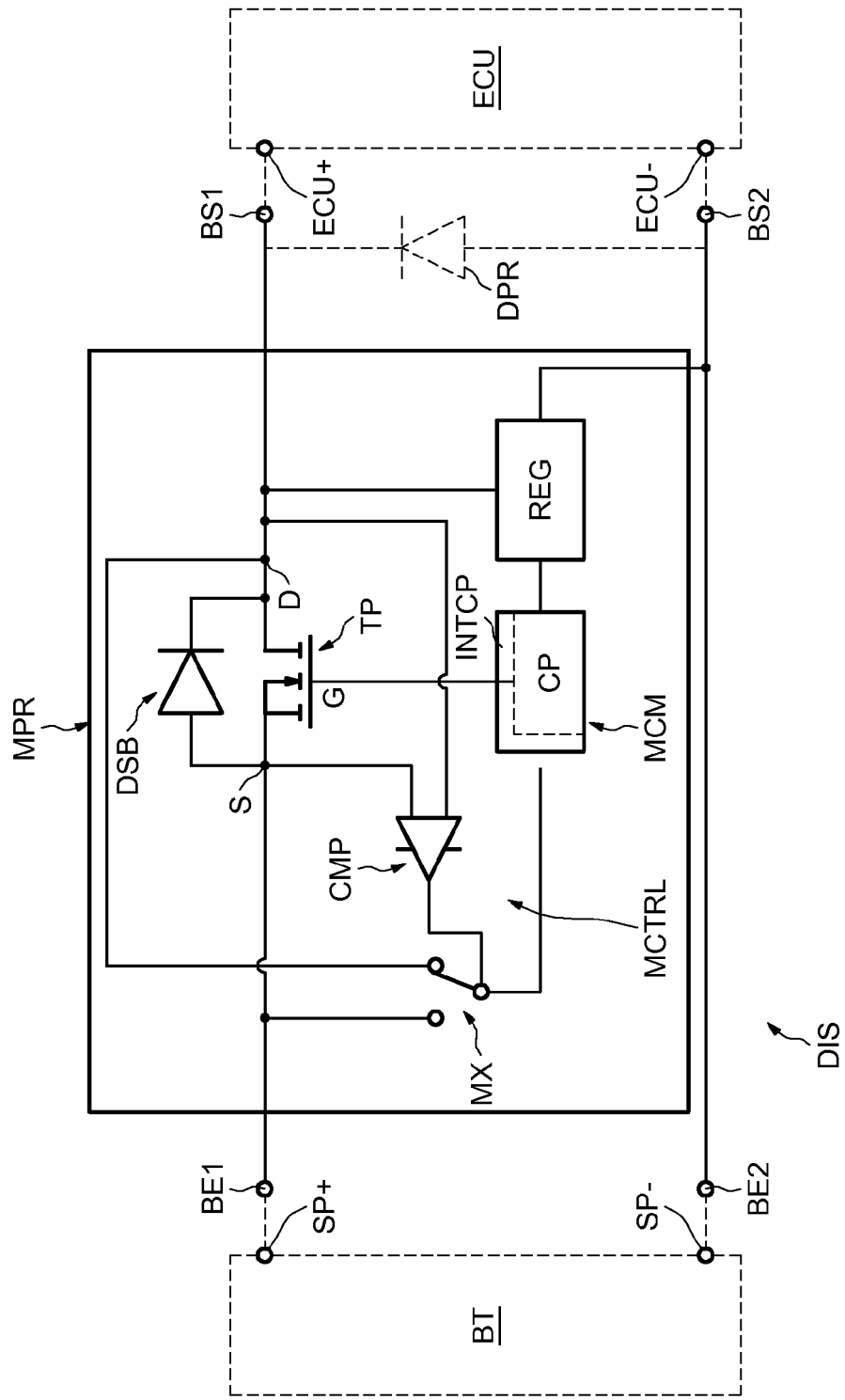
FIG. 1 diagrammatically illustrates an embodiment of a device according to the invention.

Before describing illustrative embodiments in detail, various embodiments are described generally. According to one embodiment, there is proposed a device for protecting against a polarity reversal of a DC power supply voltage that is compatible with an assembly of the type with surface-mount components, offering reduced electromagnetic emission with a smaller surface footprint.

Producing the protection means, and in particular the command means, for example a charging pump circuit, and the main transistor in an integrated fashion, whether within one and the same integrated circuit (within one and the same chip) or within two different integrated circuits that are mutually connected (one integrated circuit for the main transistor, for example a power transistor, and another integrated circuit for the rest of the protection means) makes it possible to use an optimized multiphase charging pump circuit that uses small capacitors that are switched at high frequency, with an extremely short connection between the command means and the gate of the main transistor, and an extremely reduced electromagnetic emission.

Further the main transistor is used as a protection diode. A current flows through the main transistor from the source region to the drain region, which corresponds to a current direction opposite to a conventional current direction.

Moreover, such an integrated implementation requires the provision of a dynamic adjustment of the biasing of the substrate regions of components, notably active components, connected to the main transistor, so as to ensure correct operation of the electronic device. More specifically, these active or passive components are generally those whose substrate regions (the wells for example) are electrically connected to the source or to the drain of the main transistor, or in other words those whose substrate regions (the wells for example) are likely to switch to forward bias relative to the semiconductive region underlying this substrate region and of opposite conductivity (the general substrate of the semiconductive wafer of opposite conductivity, or else another well of opposite conductivity).

Unlike a bias that would be fixed or frozen, a dynamic biasing of the substrate regions means that these regions can be biased with different voltages depending on the state of the protection means, and in particular of the relative values of the input power supply voltage and of the output power supply voltage.

More specifically, and according to an embodiment in which the substrate regions, commonly designated as "bulk" by those skilled in the art, and which can be semiconductive wells, are produced within semiconductive regions having a conductivity opposite to that of the substrate regions, for example the general substrate area of the wafer or else another well itself produced within the general substrate area of the wafer, these semiconductive regions are connected either to the first output terminal or to ground, depending on the type of conductivity of these semiconductive regions; moreover, the control means are configured to connect the substrate regions either to the source or to the drain of the main transistor according to the value of the voltages present at these two electrodes (source and drain) and the type of conductivity of these substrate regions.

Thus, for example when the substrate regions (such as wells) of the above-mentioned components, notably active components, are of P-conductivity type formed in semiconductive regions of N-conductivity type (for example, the N substrate of the wafer in an N technology or else an N well with a substrate of P-type wafer in a P technology), these N-type semiconductive regions are connected to the first output terminal, and the control means are configured to link said P substrate regions (P wells) to the source of the main transistor if the source voltage is less than the drain voltage, or to the drain of the main transistor if the source voltage is greater than the drain voltage.

Obviously, conversely, if the substrate regions of the components, notably active components, of N-conductivity type are formed in semiconductive regions of P-conductivity type, these semiconductive regions will be connected to ground, and the control means are then configured to link the N substrate regions to the source of the main transistor if the source voltage is greater than the drain voltage or to the drain of the main transistor if the source voltage is less than the drain voltage.

That said, according to one embodiment, the control means comprise a comparator whose two inputs are respectively connected to the source and to the drain of the main transistor, and a multiplexer having an input connected to said substrate regions, two outputs respectively connected to the source and to the drain of the main transistor, and a command input connected to the output of the comparator.

In some embodiments, the command means can comprise a charging pump circuit, the output of which is connected to the gate of the main transistor, with, preferably, a voltage regulation circuit connected to the first output terminal and powering the charging pump.

The device of illustrative embodiments is advantageously produced in N-type technology within one and the same integrated circuit and the main transistor can be a power MOS transistor, in particular for an application of the device as defined hereinabove, to the protection of an electronic unit of a motor vehicle against DC power supply polarity reversals.

According to another aspect, there is also proposed a system comprising a generator of a DC power supply voltage, for example a battery of a motor vehicle, an electronic unit designed to be powered by a DC voltage and a device as defined hereinabove coupled between the generator and the electronic unit. Having addressed the embodiments generally, attention is now turned to the embodiments illustrated in the figures.

In FIG. 1, the reference DIS designates an electronic device for protecting against a polarity reversal of a DC power supply voltage. More specifically, this device DIS comprises input means having a first input terminal BE1 for receiving an expected positive polarity of an input DC power supply voltage, and a second input terminal BE2 for receiving the negative polarity of the power supply voltage, the latter usually being ground.

The first input terminal BE1 is connected to the positive terminal SP+ of a generator BT, such as a vehicle battery, delivering the expected positive polarity of the input DC power supply voltage. The second input terminal BE2 is linked to the negative terminal SP− of the generator BT.

The device DIS also comprises output means comprising a first output terminal BS1 for delivering the positive polarity of an output DC power supply voltage, and a second output terminal BS2 for delivering the negative polarity of the output DC power supply voltage, usually ground.

These two output terminals are respectively connected to the two + and − input terminals, respectively referenced ECU+ and ECU−, of an electronic entity, for example an electronic command unit ECU of a motor vehicle.

The line linking the terminals BE1 and BS1 is the line of expected positive polarity of the power supply voltage, and it can be seen in FIG. 1 that an N-channel MOS main transistor, referenced TP, is mounted on this positive polarity line.

The main transistor TP forms part of electronic means MPR for protecting against a polarity reversal of the input power supply voltage. These means MPR are coupled between the input means BE1, BE2 and the output means BS1, BS2. The source S of the main transistor TP is connected to the first input terminal BE1 whereas the drain D of this transistor TP is connected to the first output terminal BS1.

In addition to the main transistor TP, the protection means MPR comprise command means MCM configured to render the main transistor blocked in the event of a polarity reversal and conducting otherwise, and control means MCTRL configured to dynamically adjust the bias of the substrate regions of active components connected to the main transistor.

The command means MCM in this case comprise a charging pump circuit CP capable of delivering, to the gate G of the main transistor TP, a voltage greater than the voltage delivered to the input terminal BE1 in normal operating mode. Typically, if the voltage delivered in normal operation to the terminal BE1 is of the order of 13 volts, the charging pump CP is capable of delivering, for example, a voltage of the order of 22 volts.

As is well known to those skilled in the art, a charging pump circuit comprises an oscillator and capacitive successive charging stages to supply an output voltage greater than the power supply voltage. These capacitive stages can be produced with switched capacitances.

As will be seen in more detail hereinbelow, an interface circuit INTCP is connected between the output of the charging pump itself, that is to say the output of the capacitive stages, and the main transistor TP.

The charging pump is powered from the output terminal BS1. This makes it possible to protect the charging pump circuit from the negative voltages since, as indicated hereinabove and as explained in more detail hereinbelow, the main transistor TP will be blocked when the voltage delivered to the terminal BE1 becomes negative.

It would be possible to directly power the charging pump circuit CP between the terminals BS1 and BS2, but in this case it would be best to provide a voltage limiting circuit, such as, for example, a diode DPR whose cathode would be connected to the terminal BS1, so as to limit the power supply voltage of the charging pump circuit below its acceptable voltage limit. A 10 volt Zener-type diode DPR can, for example, be used.

Another preferred solution is that illustrated in FIG. 1, which provides for the integration of a voltage regulator REG connected between the terminal BS1 and ground (possibly via a switch), capable of supporting the maximum voltage difference and designed to power the charging pump circuit. The protection means MPR of the device DIS are produced in an integrated fashion.

Figure 2:
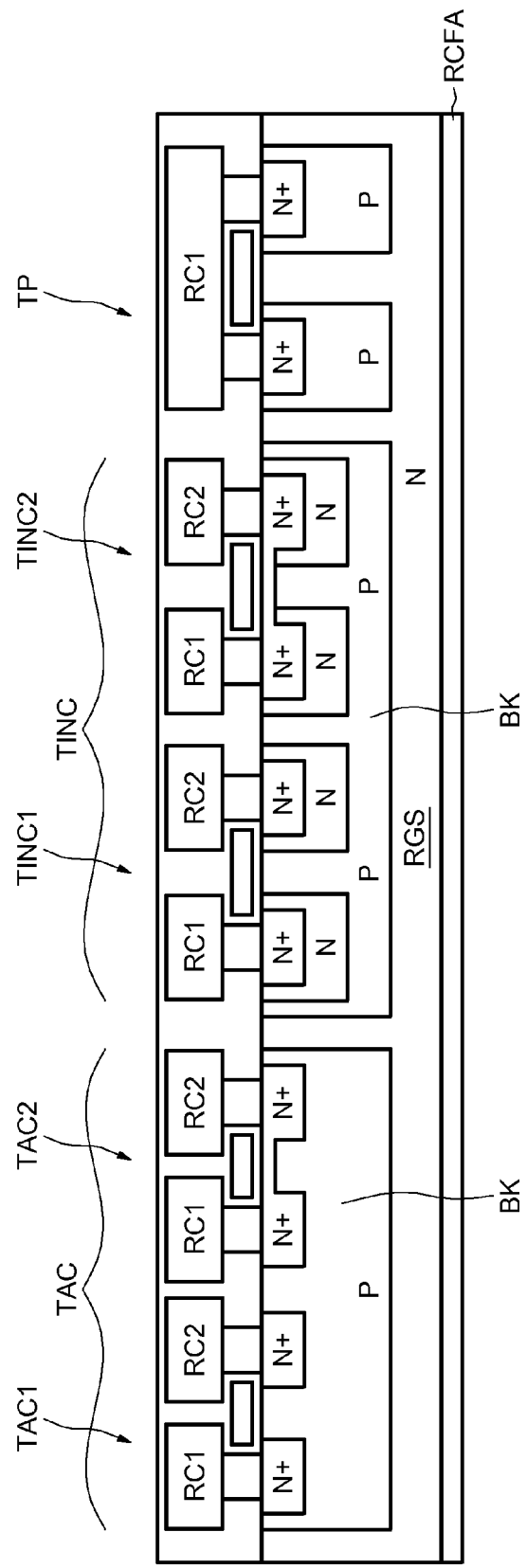
FIG. 2 diagrammatically illustrates an exemplary integrated implementation of components of the device of FIG. 1.

FIG. 2 illustrates an example of active components, such as transistors, used in the protection means MPR and implemented in this case in N technology. More specifically, in an N technology, the N-channel transistors, such as the transistors TAC or TINC, are produced within wells (sometimes referred to as caissons) BK of P-conductivity type and forming, for these transistors, P-type substrate regions.

These P wells are consequently formed within a semiconductive region RGS of N-conductivity type which is in fact, here in this example, the N substrate of the semiconductive wafer.

The transistors TINC are, in this example and in the technology used, transistors capable of supporting a voltage of 20 volts, and which can be used, for example, in the interface INTCP. The contacts RC1, RC2 of these transistors are the source/drain contacts. As an example, the transistor TINC1 is an enriched N-channel transistor, whereas the transistor TINC2 is a depleted N-channel transistor.

The transistors TAC1 and TAC2 whose contact areas RC1 and RC2 also designate the source/drain contacts are also, with regard to the transistor TAC1, an enriched N-channel transistor, and, with regard to the transistor TAC2, a depleted N-channel transistor. These transistors TAC are, however, used in the analogue circuits at lower voltage, for example 10 volts.

In this example, the N-type semiconductive region RGS is permanently connected to the first output terminal BS1, that is to say to the drain of the main transistor TP.

However, the biasing of the P-type substrate regions or wells of certain active components connected to the main transistor will be dynamically adjusted by the control means MCTRL according to the voltage values at the source and at the drain of the transistor TP. More specifically, if the source voltage of the transistor TP is less than the drain voltage, then the P-type substrate regions BK of the active components TINC for example are connected to the source S of the main transistor. However, if the source voltage of the main transistor is greater than the drain voltage, then these wells BK are linked to the drain of the transistor TP.

There is also illustrated, in the right-hand part of FIG. 2, an exemplary embodiment of the transistor TP which, here, is a vertical power N-channel transistor. The contact area RC1 is the source contact area, whereas the opposite contact area at the back of the region RGS, referenced RCFA, is the drain contact area of this transistor TP.

It can therefore be seen in this FIG. 2 that the use of an N-type technology makes it possible to produce, easily, within one and the same integrated circuit, all the protection means MPR.

Before describing FIG. 3, which illustrates an exemplary embodiment of the interface INTCP and of the control means MCTRL in more detail, the operation of the device DIS will be described.

It is assumed, initially, that the input power supply is being started up. In other words, the voltage delivered to the input terminal BE1 switches from "0" to a positive nominal voltage, for example 13 volts.

Since the main transistor TP is mounted so that its source/drain diode DSB conducts when the source voltage is greater than the drain voltage, the voltage delivered to the output terminal BS1 follows the input voltage to within a diode threshold, while remaining less than this input voltage. In other words, the drain voltage is less than the source voltage. Consequently, the P wells of the active components mentioned hereinabove are linked to the drain of the transistor TP via the multiplexer MX controlled by the comparator CMP.

In practice, in the technology used in this example, the P wells cannot be biased at a voltage greater than that of the N-type semiconductive region RGS.

When the voltage at the output terminal BS1 is sufficient to operate the voltage regulator REG, the latter powers the charging pump CP which then delivers a voltage to the gate G of the transistor TP that is much greater than the source voltage, for example a voltage of the order of 22 volts, consequently causing this transistor TP to conduct. The voltage delivered at the terminal BS1 is then substantially the same as the voltage received at the terminal BE1.

When the polarity of the input power supply voltage is reversed, the source voltage of the transistor TP becomes less than its drain voltage. In this case, the P wells of the active components mentioned hereinabove are linked to the source of the transistor TP by means of the multiplexer MX controlled by the comparator CMP.

The input polarity reversal causes the voltage to drop at the terminal BE1 which consequently leads to a voltage drop at the terminal BS1. This voltage drop will cause the regulation circuit REG to stop and therefore the powering of the charging pump CP to stop.

The latter then delivers no more current and the gate G of the main transistor TP will be discharged to follow the potential of the source S of this transistor TP. The result of this is therefore a blocking of the transistor TP and the voltage at the output terminal BS1 will be stabilized close to 0 volts.

Figure 3:
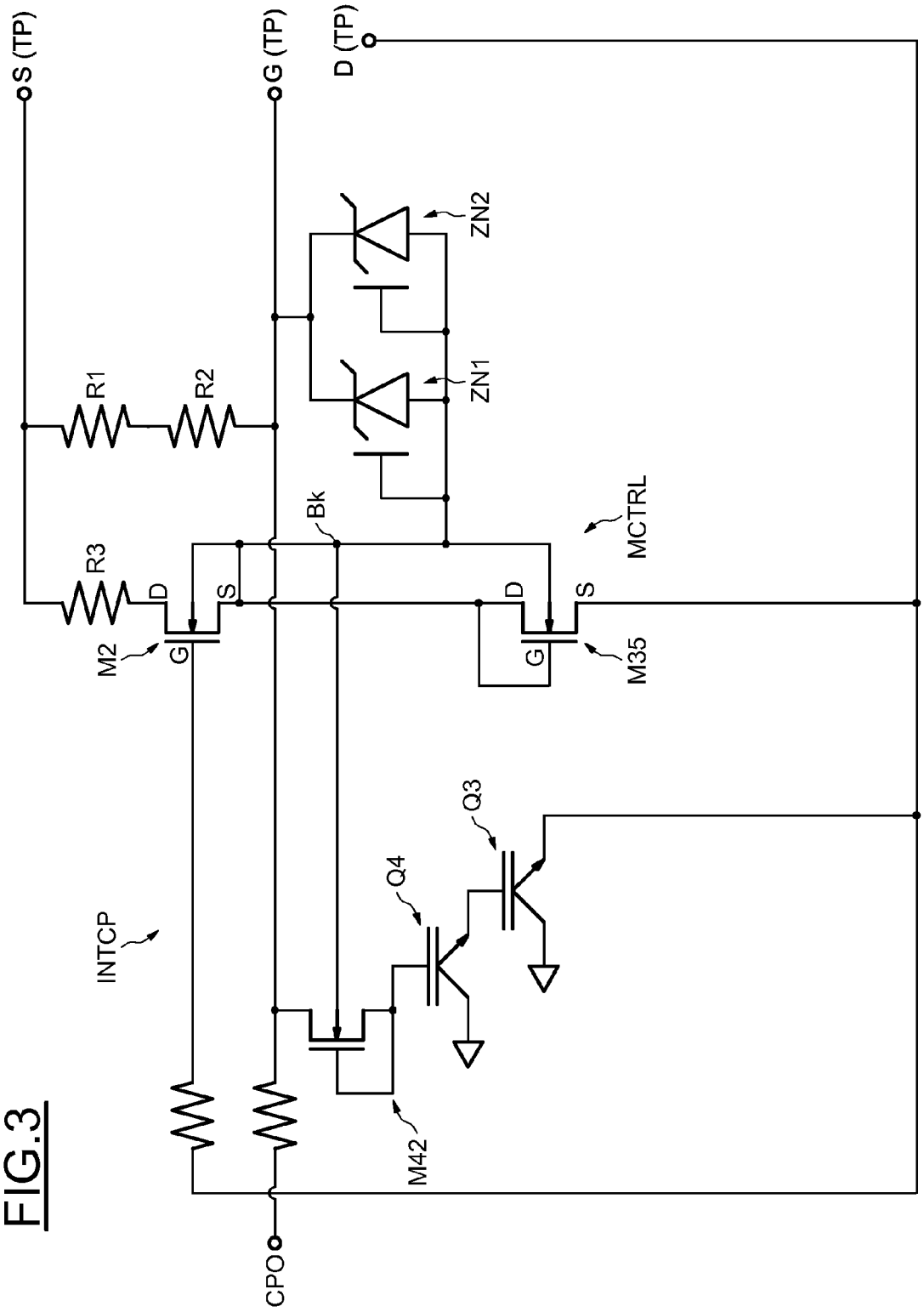
FIG. 3 illustrates, diagrammatically but in more detail, a part of the device of FIG. 1.

Reference is now made to FIG. 3, which illustrates an exemplary embodiment of the interface INTCP and of the control means MCTRL. In FIG. 3, the reference CPO designates the output of the capacitive stages of the charging pump circuit and it can be seen that this terminal CPO is linked to the gate G of the main transistor TP. Moreover, the interface INTCP here comprises a transistor M42 connected between the gate G of the transistor TP and its drain D via a group of bipolar transistors Q3 and Q4.

The transistors Q3, Q4 and M42 make it possible to re-establish the conducting of the transistor TP when the negative voltage on its source reaches a fixed value. This ensures that the transistor TP remains blocked in the event of a static polarity reversal of the power supply, while protecting the device against the negative voltage pulses which the electronic module (ECU) must survive during the qualification tests that are normally required in motor vehicle applications. For example, the standard ISO 7637/2 specifies that the module must withstand a pulse of −100 V/10 ohms/2 ms. In this case, the component described here will be restored to the conducting state when the source voltage of the transistor TP reaches approximately −20 V, and a current pulse of (100 V−20 V)/10 ohms=8 A flows between ECU− and ECU+ through the diodes normally present between these two terminals.

The interface INTCP also comprises a resistive path R1, R2 connected between the gate G and the source of the main transistor TP, and which will make it possible to discharge the gate of the transistor TP to follow the source potential during the polarity reversal, as explained hereinabove.

The interface INTCP also comprises protection Zener diodes ZN1 and ZN2, connected between the gate and the drain of the transistor TP. The active components of the interface INTCP described previously with regard to the dynamic biasing of their P well are in this case the transistor M42 and the protection diodes ZN1 and ZN2. The control means MCTRL are, in this example, implemented by an inverter, formed from a first control transistor M2 and a second control transistor M35.

More specifically, the first control transistor M2, with N channel, has a substrate region BK connected to its source S and its drain D is connected to the source S of the transistor TP via a resistor R3. The gate G of this first control transistor M2 is also linked to the drain D of the main transistor TP. The second control transistor M35 is a depleted N-channel transistor configured to be always conducting and less conductive than the transistor M2 in its conducting state.

More specifically, the source of this control transistor M35 is linked to the drain of the main transistor TP. Its gate G is linked to its drain D and its substrate region BK or well is linked to the source of the transistor M2 and consequently to the drain of the transistor M35, since the source S of the transistor M2 and the drain D of the transistor M35 are linked.

These two transistors M2 and M35 also form part of the active components whose P-type wells BK must be dynamically biased. Moreover, it can be clearly noted from FIG. 3 that all the substrate regions BK of these active components M42, M2, M35, ZN1 and ZN2 are linked together. The two control transistors M2 and M35 serve, as indicated previously, both as comparator CMP and as multiplexer MX.

In practice, if the source voltage of the main transistor is greater than the drain voltage of the main transistor, the transistor M2 is blocked because the potential of its gate is less than the potential of its source. Consequently, the substrate regions or well BK of the active components are connected to the drain of the main transistor TP since the transistor M35 is always conducting.

If, however, the source voltage of the main transistor TP becomes less than the drain voltage of the transistor TP, the transistor M2 conducts, because its gate voltage becomes greater than its source voltage, but, since the transistor M35 is designed to conduct less current than the transistor M2, the substrate regions BK of the active components are, in this case, connected to the source of the transistor TP.

What is claimed is:

1. An electronic device comprising:
   input means having a first input terminal for receiving an expected positive polarity of an input DC power supply voltage;
   output means having a first output terminal for delivering the positive polarity of an output DC power supply voltage; and
   protection means for protecting against a polarity reversal of the input DC power supply voltage coupled between the input means and the output means, the protection means including the following integrated components: an N-channel main transistor, the source of which is coupled to the first input terminal and the drain of which is coupled to the first output terminal, command means configured to render the main transistor blocked in the event of a polarity reversal and conducting otherwise, and control means configured to dynamically adjust the bias of substrate regions of respective components connected to the main transistor by connecting the substrate regions either to the source or to the drain of the main transistor according to the value of the voltages present at the source and the drain of the main transistor and the type of conductivity of the substrate regions.

2. The device according to claim 1, in which the substrate regions of said components are produced within semiconductive regions having a conductivity opposite to that of the substrate regions, the semiconductive regions (RGS) being connected either to the first output terminal (BS1) or to ground depending on the type of conductivity of these semiconductive regions.

3. The device according to claim 2, in which the substrate regions of said components are of P-conductivity type formed in semiconductive regions of N-conductivity type connected to the first output terminal, and the control means are configured to link said P-conductivity type substrate regions to the source of the main transistor if the source voltage is less than the drain voltage or to the drain of the main transistor if the source voltage is greater than the drain voltage.

4. The device according to claim 2, in which the control means comprises a comparator having two inputs respectively connected to the source and to the drain of the main transistor, and a multiplexer having an input connected to said substrate regions, two outputs respectively connected to the source and to the drain of the main transistor, and a command input connected to the output of the comparator.

5. The device according to claim 2, in which the control means comprises a first control transistor having a substrate region connected to its source, the drain of which is connected to the source of the main transistor and the gate of which is connected to the drain of the main transistor, and a second control transistor configured to be conducting, having its source connected to the drain of the main transistor, its substrate region connected to its drain and to the substrate region of the first control transistor and its gate connected to its drain, the drain of this second control transistor being connected to the source of the first control transistor, the substrate regions of said components being connected to the substrate regions of the first and second control transistors which themselves form part of said components.

6. The device according to claim 1, in which the command means comprises a charging pump circuit, the output of which is connected to the gate of the main transistor.

7. The device according to claim 6, in which the command means comprises a voltage regulation circuit connected to the first output terminal and powering the charging pump.

8. The device according to claim 1, produced in N-type technology within a single integrated circuit.

9. The device according to claim 1, wherein the main transistor is a power MOS transistor.

10. An electronic device for protecting against a polarity reversal of a DC power supply voltage, comprising:
an N-channel main transistor mounted on a line of expected positive polarity of the DC power supply voltage;
the dynamic biasing circuit configured to bias substrate regions of active components connected to the main transistor according to the value of voltages present at the source and at drain of the main transistor and the type of conductivity of the substrate regions; and
command means for the main transistor comprising a charging pump circuit associated with the dynamic biasing circuit;
wherein the main transistor and the command means are formed on a single integrated circuit.

11. A method for protection of an electronic unit against polarity reversals of a DC power supply comprising: receiving an expected positive polarity of an input DC power supply voltage at a first input terminal;
delivering the positive polarity of an output DC power supply voltage to the electronic unit at a first output terminal; and
protecting against a polarity reversal of the input DC power supply voltage coupled between the first input terminal and the first output terminal by rendering a main transistor, having its source coupled to the first input terminal and its drain coupled to the first output terminal, blocked in the event of a polarity reversal and conducting otherwise and by dynamically adjusting the bias of substrate regions of respective components connected to the main transistor by connecting the substrate regions either to the source or to the drain of the main transistor.

12. A system comprising:
a generator of a DC power supply voltage;
an electronic unit designed to be powered by a DC voltage; and
a device coupled between the generator and the electronic unit, the device including:
a first input terminal configured to receive an expected positive polarity of an input DC power supply voltage;
a first output terminal configured to deliver the positive polarity of an output DC power supply voltage; and
protection means for protecting against a polarity reversal of the input DC power supply voltage coupled between the first input terminal and the first output terminal, the protection means including the following integrated components: an N-channel main transistor, the source of which is coupled to the first input terminal and the drain of which is coupled to the first output terminal, command means configured to render the main transistor blocked in the event of a polarity reversal and conducting otherwise, and control means configured to dynamically adjust the bias of substrate regions of respective components connected to the main transistor by connecting the substrate regions either to the source or to the drain of the main transistor according to the value of the voltages present at the source and the drain of the main transistor.

13. The system of claim 12 wherein the components of the protection means are formed on a single integrated circuit.

* * * * *